US011489657B1

(12) United States Patent
Lin et al.

(10) Patent No.: US 11,489,657 B1
(45) Date of Patent: Nov. 1, 2022

(54) BIT-LEVEL MODE RETIMER (71) Applicant: Diodes Incorporated, Milpitas, CA (US)

(72) Inventors: Yu-Wei Lin, New Taipei (TW); Yi Sheng Lin, New Taipei (TW); Nanyuan Chen, Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 17/451,563

(22) Filed: Oct. 20, 2021

(51) Int. Cl.
*H04L 7/033* (2006.01)
*H04L 7/00* (2006.01)
*H03H 17/02* (2006.01)

(52) U.S. Cl.
CPC ............ *H04L 7/033* (2013.01); *H03H 17/02* (2013.01); *H04L 7/0025* (2013.01)

(58) Field of Classification Search
CPC ....... H03H 17/02; H04L 7/002; H04L 7/0025; H04L 7/0029; H04L 7/033; H04L 27/066
USPC ....... 375/219, 220, 222, 324, 326, 327, 371, 375/373, 376; 327/144, 145, 147, 156, 327/161; 370/516–518; 713/400, 401, 713/503, 600
See application file for complete search history.

(56) References Cited

U.S. PATENT DOCUMENTS

| | | | |
|---|---|---|---|
| 9,091,711 B1 * | 7/2015 | Wang | H04L 7/033 |
| 2014/0126613 A1 * | 5/2014 | Zhang | H04B 1/745 |
| | | | 375/219 |
| 2014/0281071 A1 * | 9/2014 | Xu | G06F 13/42 |
| | | | 710/105 |
| 2014/0361815 A1 * | 12/2014 | Depaoli | H03B 5/124 |
| | | | 327/122 |
| 2021/0313993 A1 * | 10/2021 | Bai | H04L 7/005 |

FOREIGN PATENT DOCUMENTS

TW    1736393 B  *  8/2021

OTHER PUBLICATIONS

Lee et al., "A Power-and-Area Efficient 10x10 Gb/s Bootstrap Transceiver in 40 nm CMOS for Referenceless and Lane-Independent Operation", IEEE Journal of Solid-State Circuits, vol. 51, No. 10, pp. 2475-2484 (Oct. 2016).*

* cited by examiner

*Primary Examiner* — Young T. Tse
(74) *Attorney, Agent, or Firm* — Weaver Austin Villeneuve & Sampson LLP (57) ABSTRACT

Disclosed are some examples of retimer circuitry, systems and methods. In some implementations, clock data recovery circuitry is coupled between a receiver and a transmitter. The clock data recovery circuitry is configured to: extract a data component from an input data signal associated with the receiver, provide the data component to the transmitter, and generate a phase control signal. Phase interpolator circuitry is coupled with the clock data recovery circuitry. The phase interpolator circuitry includes a phase interpolator configured to: receive the phase control signal, generate, based on the phase control signal, an output clock signal, and provide the output clock signal to the transmitter to track data packets of the data component.

25 Claims, 4 Drawing Sheets

BIT-LEVEL MODE RETIMER

BACKGROUND

A retimer, also known as a re-timer, generally refers to electrical circuitry having a clock data recovery circuit that retimes a signal. Retimers can be used to extend the physical length of a system by creating separate clock domains on either side of the retimer. Retimers came to prominence with the emergence of carrier systems in telecommunications, particularly with T1 and E1. For instance, some conventional carrier systems carry multiple channels of voice circuits over a shielded twisted pair with a retimer installed every few thousand feet.

Without a retimer or redriver, the integrity of signals transmitted in a system can degrade with increases in the frequency or data rate of the signals and/or the length of transmission lines. The problem of signal degradation over interfaces can be addressed by the use of repeaters between connected devices. A repeater can be implemented as a retimer or redriver. Retimers and redrivers can restore or enhance signal integrity as data is transmitted between the connected devices.

SUMMARY

According to some implementations, retimer circuitry includes clock data recovery circuitry coupled between a receiver and a transmitter. The clock data recovery circuitry is configured to: extract a data component from an input data signal associated with the receiver, provide the data component to the transmitter, and generate a phase control signal. Also included in the retimer circuitry is phase interpolator circuitry coupled with the clock data recovery circuitry. The phase interpolator circuitry includes a phase interpolator configured to: receive the phase control signal, generate, based on the phase control signal, an output clock signal, and provide the output clock signal to the transmitter to track data packets of the data component.

In some implementations, the retimer circuitry further includes an analog-to-digital converter coupled between the receiver and the clock data recovery circuitry. In some implementations, the retimer circuitry further includes a further phase interpolator of the phase interpolator circuitry. The further phase interpolator is configured to: receive the phase control signal, generate, based on the phase control signal, a further output clock signal, and provide the further output clock signal to the analog-to-digital converter. The analog-to-digital converter is configured to generate the input data signal based on the further output clock signal. In some implementations, one or more electrical characteristics of the further phase interpolator match one or more electrical characteristics of the phase interpolator. In some implementations, the phase interpolator and the further phase interpolator are configured to generate the respective output clock signals based on the phase control signal by processing control codes of the phase control signal to control a phase of a base clock signal.

In some implementations, the retimer circuitry further includes a digital filter coupled between the clock data recovery circuitry and the phase interpolator. The digital filter is configured to perform digital filtering of the phase control signal to remove or reduce one or more frequency components associated with jitter noise. In some implementations, the digital filter includes one or more low-pass filters. In some implementations, a low-pass filter can include one or more moving average filters. For instance, two or more moving average filters can be coupled in series and have the same or different configurations.

In some implementations, a moving average filter can be configured according to: OUT(m, next)=OUT(m, previous)+1/m(X(n+1)−X(n−m+1)), where OUT(m) is a smoothed output of the moving average filter, X(n) is a sequence of control codes of the phase control signal, and m is a dividing factor. In some other implementations, a moving average filter is configured according to: OUT(n)=OUT(n−1)+1/N(P(n)−P(n−N)), where OUT(n) is a smoothed output of the moving average filter, P(n) is a sequence of control codes of the phase control signal, N=2^m, and m is a dividing factor. In some implementations, a moving average filter includes two or more m-bit shift circuits, two or more delay units, and two or more adders.

In some implementations, a retimer system includes: a first device, a second device, and a data interface connecting the first and second devices. The data interface includes a repeater. The repeater includes clock data recovery circuitry coupled between a receiver in communication with the first device and a transmitter in communication with the second device. The repeater further includes phase interpolator circuitry coupled with the clock data recovery circuitry.

In some implementations, a retiming method includes: extracting a data component from an input data signal associated with a receiver, providing the data component to a transmitter, generating a phase control signal, generating, based on the phase control signal, an output clock signal, and providing the output clock signal to the transmitter to track data packets of the data component.

In some implementations, the retiming method further includes performing digital filtering of the phase control signal to remove or reduce one or more frequency components associated with jitter noise. For instance, the digital filtering can include low-pass filtering.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Some of the disclosed implementations relate to a retimer primarily implemented in the digital domain to actively retransmit a fresh copy of data packets of an input data signal using a clean clock. Some examples of the disclosed retimers can be implemented in applications to provide enhanced reach. Examples of such applications include but are not limited to: reaching corners of a large printed circuit board (PCB), using additional connectors, supporting a daughter card, reaching an extension shelf, compensating for use of inferior PCB materials, and enhancing device operations.

Some implementations of this disclosure relate to retimer circuitry and techniques for phase control by generating and sending phase control codes from a clock data recovery circuit (CDR) through a digital filter to a phase interpolator (PI) in communication with a transmitter (Tx). The phase control codes control the PI, and an output clock signal of the PI is delivered to Tx to track a parallel data stream or other part of a data component extracted from the input data signal by the CDR and provided by the CDR to Tx.

In some implementations, the digital filter coupled between the CDR and the PI is configured to improve signal quality of a phase control signal carrying the phase control codes by digital signal conditioning. For instance, the digital filter can perform high frequency filtering in the digital domain on the phase control signal to reduce jitter noise. In some implementations, the digital filter includes one or more low-pass finite impulse response (FIR) filters. For instance, the low-pass FIR filter can be implemented to include one or more moving average (MA) filters. Such a MA filter is configured to smooth discrete time data of the phase control signal, that is, remove unwanted high frequency components of the phase control signal, since high frequency components of the signal often represent jitter noise. Also or alternatively, other types of low-pass FIR filters can be incorporated in the digital filter, as can low-pass infinite impulse response (IIR) filters.

Some implementations of retimer circuitry and techniques disclosed herein can be practiced using a variety of transmission protocols, such as those used to transmit serial data between connected devices. Examples of such protocols include the DisplayPort standard, the High-Definition Multimedia Interface (HDMI) standard, the Serial ATA standard, the Peripheral Component Interconnect Express (PCI-E) standard, the Universal Serial Bus (USB) standard, the Hypertransport protocol, Infiniband protocol, the XAUI protocol, and the Ethernet protocol. Each of these protocols has evolved over time to include multiple generations and, at least for some, multiple versions within each generation. Serial interfaces may be implemented according to any of these standards using either single-ended or differential signaling.

It should be noted that circuits and techniques enabled by the present disclosure are more generally applicable. For instance, any serial or parallel interface or protocol may benefit from the techniques described herein. The scope of the present disclosure should therefore not be limited by reference to such implementations.

Figure 1A:
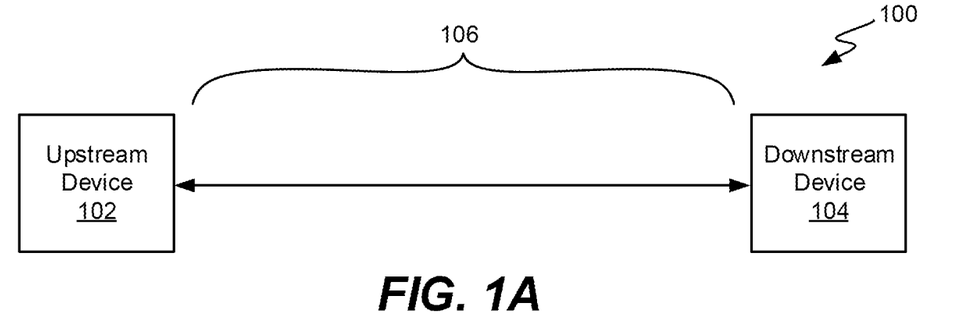
FIG. 1A is a block diagram depicting an example of a data transmission system in the form of a serial interface communication system 100.

FIG. 1A is a block diagram depicting an example of a data transmission system in the form of a serial interface communication system 100. System 100 may be implemented according to any of the variety of transmission protocols mentioned above, including, for example, the DisplayPort standard, the HDMI standard, the Serial ATA standard, the PCI-E standard, the USB standard, the Hypertransport protocol, Infiniband protocol, the XAUI protocol, the Ethernet protocol, or any of the generations and/or versions of each.

System 100 includes an upstream device 102, a downstream device 104, and a serial bus 106. It should be appreciated that system 100 may be a bidirectional communication system, where upstream device 102 is capable of both transmitting and receiving, and downstream device 104 is capable of both transmitting and receiving.

It should also be appreciated that bidirectional implementations of system 100 may include full-duplex implementations and half-duplex implementations with switching interfaces for Tx and receiver (Rx) ports. It should further be appreciated that system 100 may be a unidirectional communication system, in which upstream device 102 is capable of transmitting and downstream device 104 is capable of receiving.

Figure 1B:
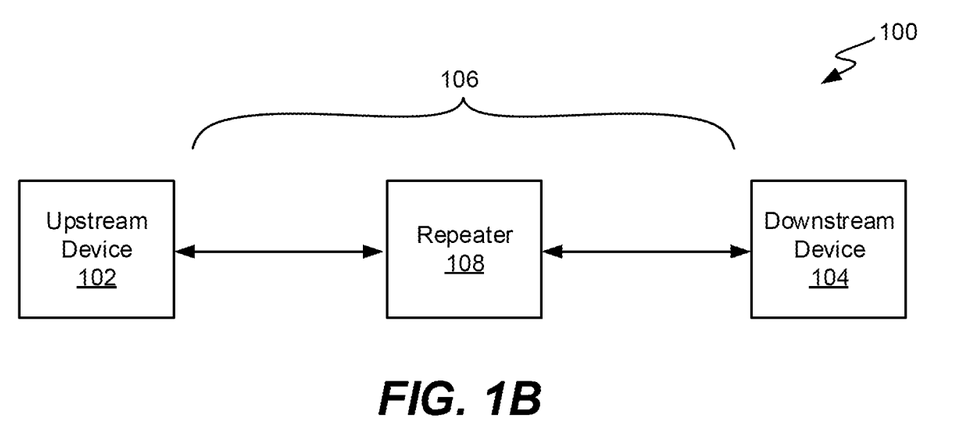
FIG. 1B is a block diagram depicting an example of some implementations of system 100 in which a bus includes one or more repeaters 108.

FIG. 1B is a block diagram depicting an example of some implementations of system 100 in which a bus includes one or more repeaters 108, which are examples of intermediary high-speed signal conditioning transceivers. Repeaters can be coupled in series, with the number of such devices depending on trace or cable length of the bus. A repeater 108 may be used as a serial link driver interface for serial bus 106, or multiple repeaters 108 may be used to provide a serial link driver interface for serial bus 106. Additionally, it should be appreciated that serial bus 106 includes traces or cables formed in or using a transmission medium such as conductive material or other means for propagating electric signals. It should further be appreciated that implementations of serial bus communication system 100 including one or more repeaters may be full-duplex bidirectional, half-duplex bidirectional, or unidirectional as described for FIG. 1A.

In FIGS. 1A and 1B, upstream device 102 may be implemented in a larger device or system such as any of a variety of integrated circuits or devices including, but not limited to, input/output (I/O) hubs, root complexes, servers, and laptop docking stations, among others. Furthermore, it should be appreciated that downstream device 104 may be implemented in a larger device or system such as any of a variety of peripheral devices including, but not limited to, hard disk drives, graphics cards, and daughter cards, among others. It should be appreciated that reference to upstream device and downstream device are for purposes of example, and the examples of upstream device 102 and downstream device 104 listed above can correspond to terminal communication devices for serial standards that do not utilize a hierarchical topology.

Communication via serial bus 106 may use a differential or single-ended signaling protocol. For example, upstream device 102 may include a differential output driver (not shown) for providing a differential signal. Repeater 108, when present, processes an output transmission from upstream device 102 to provide such processed output transmission to another repeater or directly to downstream device 104. Downstream device 104 may include a differential input driver (not shown). There are many known differential digital signaling protocols that may be used with serial bus communication system 100 such as, for example, differential Stub-Series Terminated Logic (SSTL), differential High-Speed Transceiver Logic (HSTL), Low-Voltage Differential Signaling (LVDS), differential Low-Voltage Positive Emitter Coupled Logic (LVPECL), and Reduced Swing Differential Signaling (RSDS) among other differential digital signaling protocols. Additionally, implementations are contemplated that use single-ended serial interface protocols such as, for example, Low Voltage Transistor-Transistor Logic (LVTTL) such as used for PCI, and Low Voltage Complementary Metal Oxide Semiconductor (LVCMOS), among other single-ended serial interface protocols. Conventionally PCI uses an LVTTL input buffer and a push-pull output buffer.

Figure 2:
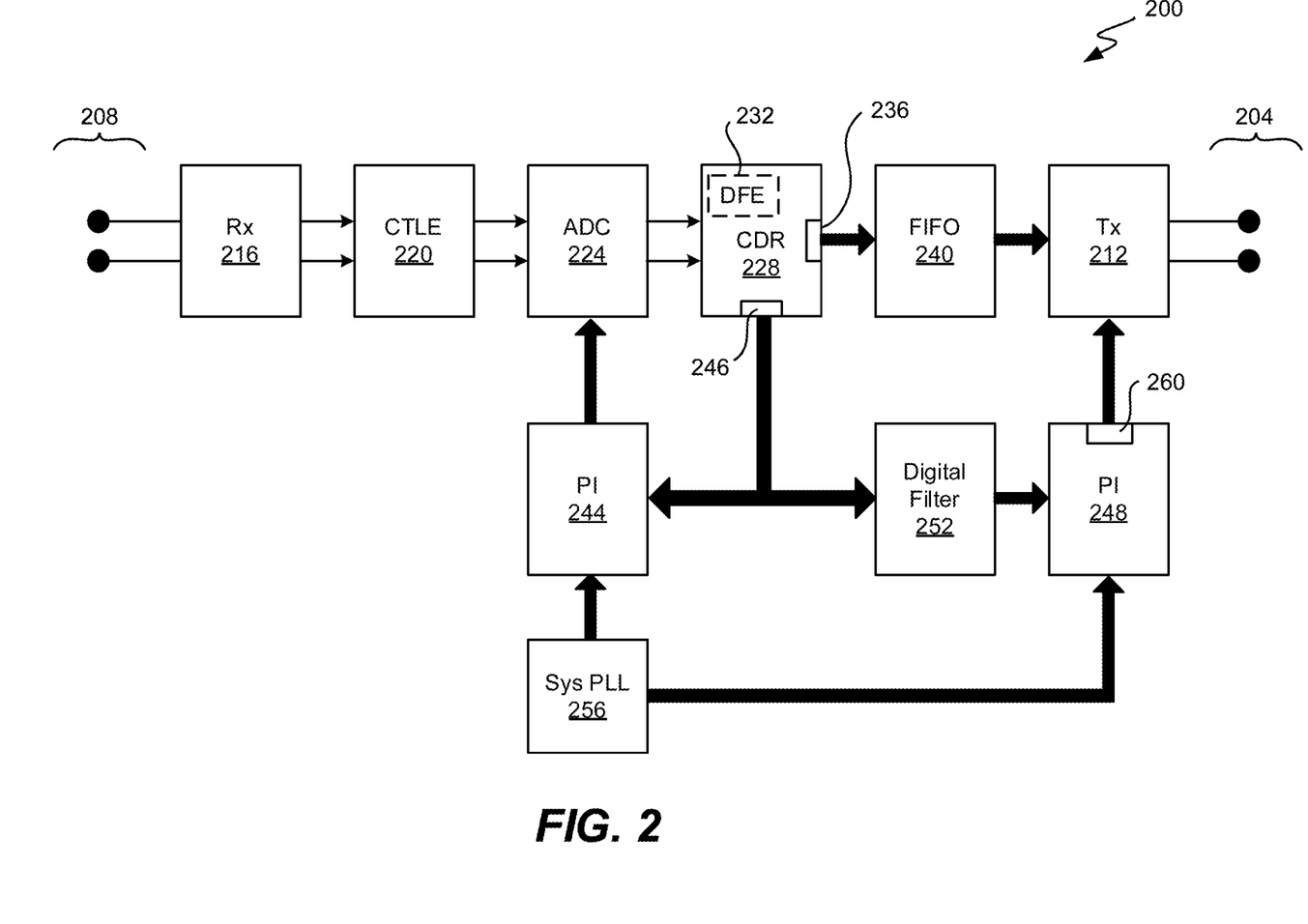
FIG. 2 is a block diagram depicting an example of a retimer 200 according to some implementations.

FIG. 2 is a block diagram depicting an example of a retimer 200, which can serve as a repeater in some implementations. Retimer 200 is primarily implemented in the digital domain using a combination of circuit components described herein. Retimer 200 includes a Tx port 204 and a Rx port 208 for connecting with an upstream device or a downstream device. In the depicted example, ports 204 and 208 of retimer 200 employ differential signaling; however, single-ended implementations also are possible.

In FIG. 2, retimer 200 includes Tx 212 at Tx port 204 and Rx 216 at Rx port 208. Tx 212 can be any circuitry or device capable of transmitting signals, including signals carrying data. By way of illustration, Tx may include a light-emitting diode (LED) or a laser diode. Rx 216 can be any circuitry or device capable of receiving signals.

In FIG. 2, coupled to Rx 216 is a continuous time linear equalizer (CTLE) 220, which can be incorporated to process a received signal from Rx 216 and equalize frequency dependent loss in the signal, for instance, experienced in a communications channel. An output of CTLE 220 is coupled to an input of an analog-to-digital converter (ADC) 224, which converts the equalized signal from CTLE 220 to a digital data signal. For instance, ADC 224 can be implemented as a 5-bit time interleaved ADC. ADC 224 has outputs coupled to pass the digital data signal to an input of CDR 228, which optionally includes an integrated decision feedback equalizer (DFE) 232 in this example. DFE 232 can serve as a nonlinear equalizer, suppressing inter-symbol interference (ISI) due to channel imperfections such as high frequency losses and notches. A data output 236 of CDR 228 is coupled to a first in first out circuit (FIFO) 240, which processes and outputs the data component extracted by CDR 228 to Tx 212 as illustrated. In particular, FIFO 240 is coupled between CDR 228 and Tx 212 and configured as a buffer for data packets of the data component to be transferred from CDR 228 to Tx 212. In some implementations, FIFO 240 transfers data packets as multi-bit parallel data signals, while in some other implementations, FIFO 240 operates in serial fashion to transfer data packets sequentially.

In FIG. 2, CDR 228 of retimer 200 is of a digital type, particularly a phase interpolator based CDR, which is configured to communicate with PIs, as opposed to conventional analog type CDRs, which typically communicate with analog circuitry such as a phase-locked loop (PLL). Retimer 200 further includes: a first PI 244 coupled between a PI control output 246 of CDR 228 and ADC 224, as well as a second PI 248 coupled between PI control output 246 and Tx 212. First PI 244 is associated with Rx 216, while second PI 248 is associated with Tx 212. A digital filter 252 is coupled between PI control output 246 and second PI 248. In this example, first PI 244 can be implemented with four different phase clock inputs and an adjustable current source to update the phase output of a sampling clock provided as an output clock signal to ADC 224.

In FIG. 2, electrical characteristics of first PI 244 are duplicated or closely matched by second PI 248, for instance, when they are implemented on the same chip. Configuring second PI 248 in this manner can be beneficial since a PI often is an available circuit in terms of chip design and manufacture. The same phase control of first PI 244 and second PI 248 is provided by delivering the same phase control signal from PI control output 246 of CDR 228 to first PI 244 and second PI 248. A clock output 260 of second PI 248 can deliver to Tx an output clock signal to track a parallel data stream of the data component provided from FIFO 240 to Tx 212 accordingly.

In FIG. 2, a system PLL (SysPLL) 256 may be external to retimer 200 in some implementations but is illustrated as part of retimer 200 in this example to facilitate understanding. SysPLL 256 can be implemented as an all-digital PLL (ADPLL) by way of illustration. SysPLL 256 outputs a base clock signal to both first PI 244 and second PI 248. The phase control signal delivered from CDR 228 to first and second PIs 244 and 248 controls the PIs 244 and 248 to change the phase of the base clock signal. Each PI generates a respective output clock signal accordingly. First PI 244 provides an output clock signal to ADC 224, while second PI 248 can set an output clock signal at clock output 260, where this output clock signal is aligned with the data stream provided at Tx 212.

In operation, CDR 228 tracks an incoming bit stream of the digital data signal mentioned above and extracts both an embedded clock signal and a data component from the bit stream. In this example, CDR 228 does so by examining phase information from the data sampled by ADC 224 and continuously updating the phase control signal to first PI 244. If CDR 228 finds that the sampled data is ahead of the output clock signal provided from first PI 244 to ADC 224, CDR 228 updates the phase control signal to correspondingly increase the clock frequency, and vice versa. The target is to align the base clock signal generated by SysPLL 256 with the embedded clock signal and sample the data at the optimal timing.

In this example, CDR 228 collects the sampled data over a specific period of time and uses a statistical method to determine if and when to update the phase control signal. In some implementations, CDR 228 also can filter out some unwanted data patterns in the bit stream to prevent generating an incorrect phase control signal.

In one example, the phase control signal delivered to first and second PIs 244 and 248 is 34 bits, and can be categorized into two parts: a 2-bit quadrant part and a 32-bit code part. For instance, the phase control signal can be updated up to 2 bits at a time—1 bit in the quadrant part and 1 bit in the code part—to avoid coupling in physical circuitry. In such instances, the phase control signal is updated by 1 bit most of the time and updated by 2 bits only when the quadrant is changed.

In FIG. 2, in this example, ADC 224 can be implemented as a flash 5-bit ADC with 2-bit interpolation, by way of illustration. For instance, ADC 224 can include four time-interleaved ADCs with an input bandwidth higher than 10 GHz. ADC 224's sampling clock can run at 5 GHz with an effective number of bits (ENOB) above 4.5 bits, by way of example. In such an implementation, DFE 232 can receive the four time-interleaved ADCs' output data and process/optimize DFE coefficients accordingly. CDR 228 can apply an algorithm to adjust early/late sampling based on the output clock signal from PI 244.

In FIG. 2, digital filter 252 is coupled between CDR 228 and second PI 248 and configured to perform high frequency filtering on the phase control signal in the digital domain to alleviate toggling of the phase control signal from PI control output 246 of CDR 228. Digital filter 252 can be implemented with a tailored transfer function to filter phase control codes of the phase control signal before the phase control codes are inputted to second PI 248.

Internal digital logic, a state machine and/or a microcontroller can be used to control and otherwise manage components of retimer 200 including CTLE 220, ADC 224, CDR 228, FIFO 240, digital filter 252, and first and second PIs 244 and 248. Internal digital logic, a state machine, and/or a microcontroller also can manage automatic adaptation of CTLE 220 and DFE 232 and implement protocol link training and status updates.

In some implementations, a digital filter such as digital filter 252 of FIG. 2 includes one or more low-pass FIR or IIR filters. For instance, a low-pass FIR filter can be implemented to include one or more cascaded MA filters to smooth discrete time data of the phase control signal. In some implementations, a MA filter can be configured to have a sliding window structure, where the size of the window is a dividing factor. For instance, the MA filter can operate according to the following formula:

$$OUT(m,\text{next})=OUT(m,\text{previous})+1/m(X(n+1)-X(n-m+1)), \text{ where:}$$

OUT(m) is output data;
X(n) is sampled input data, for instance, a sequence of phase control codes of the phase control signal output from a CDR to control a PI;
n=0, 1, 2, . . . ; and
m is a dividing factor of 8, 16, 32, 64, 128, 256, etc.

In the formula above, when calculating the next MA value, the logic of the MA filter adds the new sampled data (X(n+1)) and subtracts the old sampled data (X(n−m+1)). Such an implementation of the MA filter is desirable when compared with some conventional low-pass FIR filters, because the disclosed MA filter can be implemented with an adder and a subtractor, that is, without multipliers.

Figure 3:
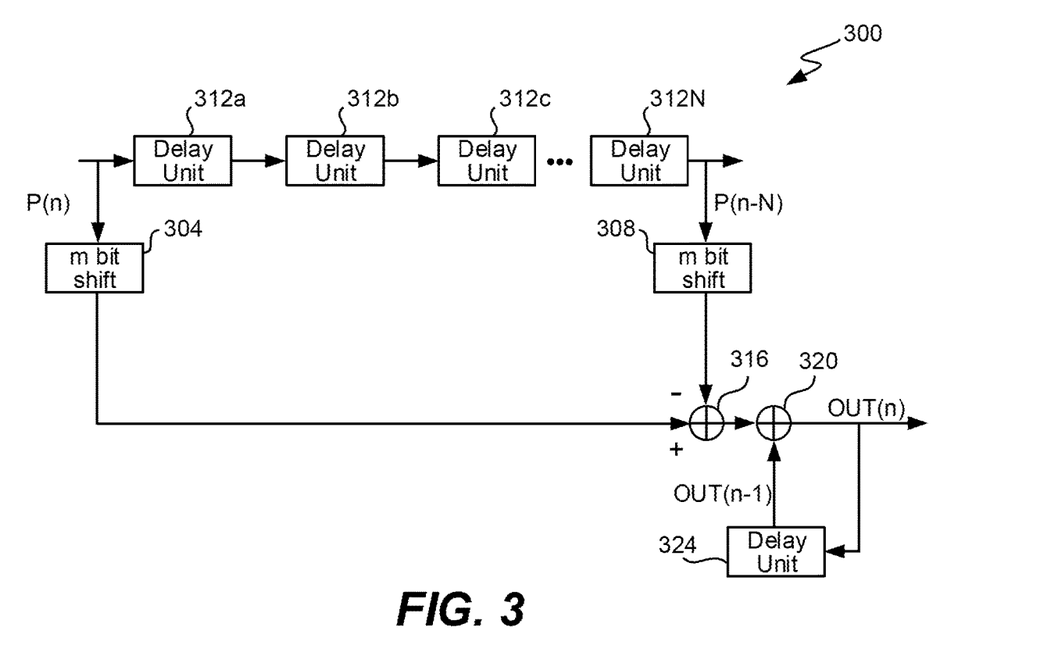
FIG. 3 is a block diagram depicting an example of a moving average filter 300 according to some implementations of a digital filter.

FIG. 3 is a block diagram depicting an example of a MA filter 300 according to some implementations of a digital filter, such as digital filter 252 of FIG. 2. In this example, MA filter 300 is implemented with two m-bit shift circuits 304 and 308 instead of the multipliers of a conventional low-pass FIR filter. In FIG. 3, MA filter 300 operates according to the following formula:

$$OUT(n)=OUT(n-1)+1/N(P(n)-P(n-N)), \text{ where:}$$

OUT(n) is output data;
P(n) is sampled input data, for instance, a sequence of phase control codes of the phase control signal output from a CDR to control a PI;
n=0, 1, 2, . . . ; and
N=2^m, where m is a dividing factor of 8, 16, 32, 64, 128, 256, etc.

In FIG. 3, MA filter 300 includes N delay units 312a, 312b, 312c . . . 312N coupled in series to receive P(n) at an input and generate P(n−N). P(n) also is provided as an input to shift circuit 304, while P(n−N) is provided as an input to shift circuit 308. An output of shift circuit 308 is subtracted from an output of shift circuit 304 at a first adder 316, in this example. A second adder 320 receives an output of first adder 316 and interacts with a further delay unit 324 to produce OUT(n) based on OUT(n−1) as well as 1/N(P(n)−P(n−N)) according to the formula above.

Figure 4:
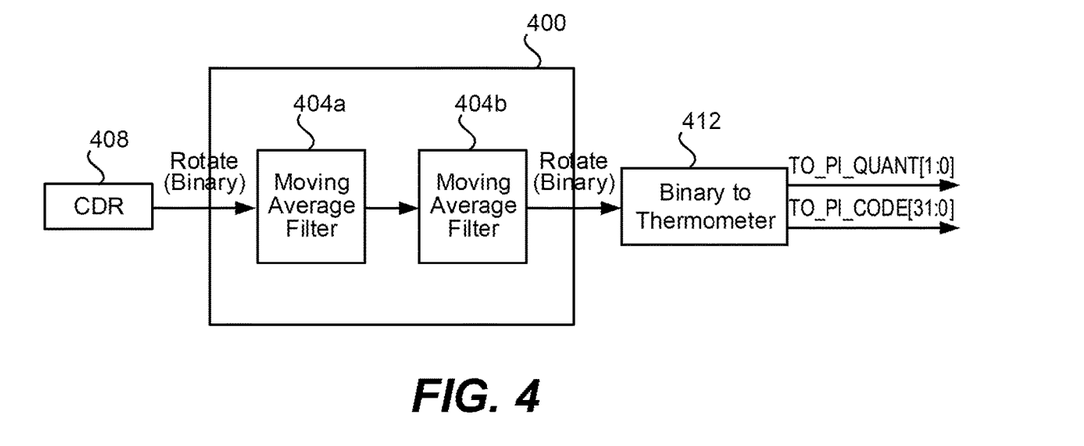
FIG. 4 is a block diagram depicting an example of a low-pass filter 400 including at least two moving average filters 404a and 404b according to some implementations of a digital filter.

FIG. 4 is a block diagram depicting an example of a low-pass filter 400 including at least two cascaded MA filters 404a and 404b according to some implementations of a digital filter. In this example, a phase control signal output from CDR 408 is first smoothed by MA filter 404a and then smoothed by MA filter 404b. In this example, the output of MA filter 404b is provided to a binary-to-thermometer 412 for binary-to-thermometer decoding before being passed to another component such as a PI. In this example, both MA filters operate according to the previous formula, namely:

$$OUT(n)=OUT(n-1)+1/N(P(n)-P(n-N)), \text{ where:}$$

OUT(n) is output data;
P(n) is sampled input data, for instance, a sequence of phase control codes of the phase control signal output from a CDR to control a PI; and
n=0, 1, 2, . . . .

In the example of FIG. 4, however, MA filter 404a supports N=8, 16, 32 and 64, by way of illustration, while MA filter 404b supports N=4. In other examples, N can be 2, 4, 8, 16, 32, 64, 128, 256 or 512 for either or both MA filters 404a and 404b.

Figure 5:
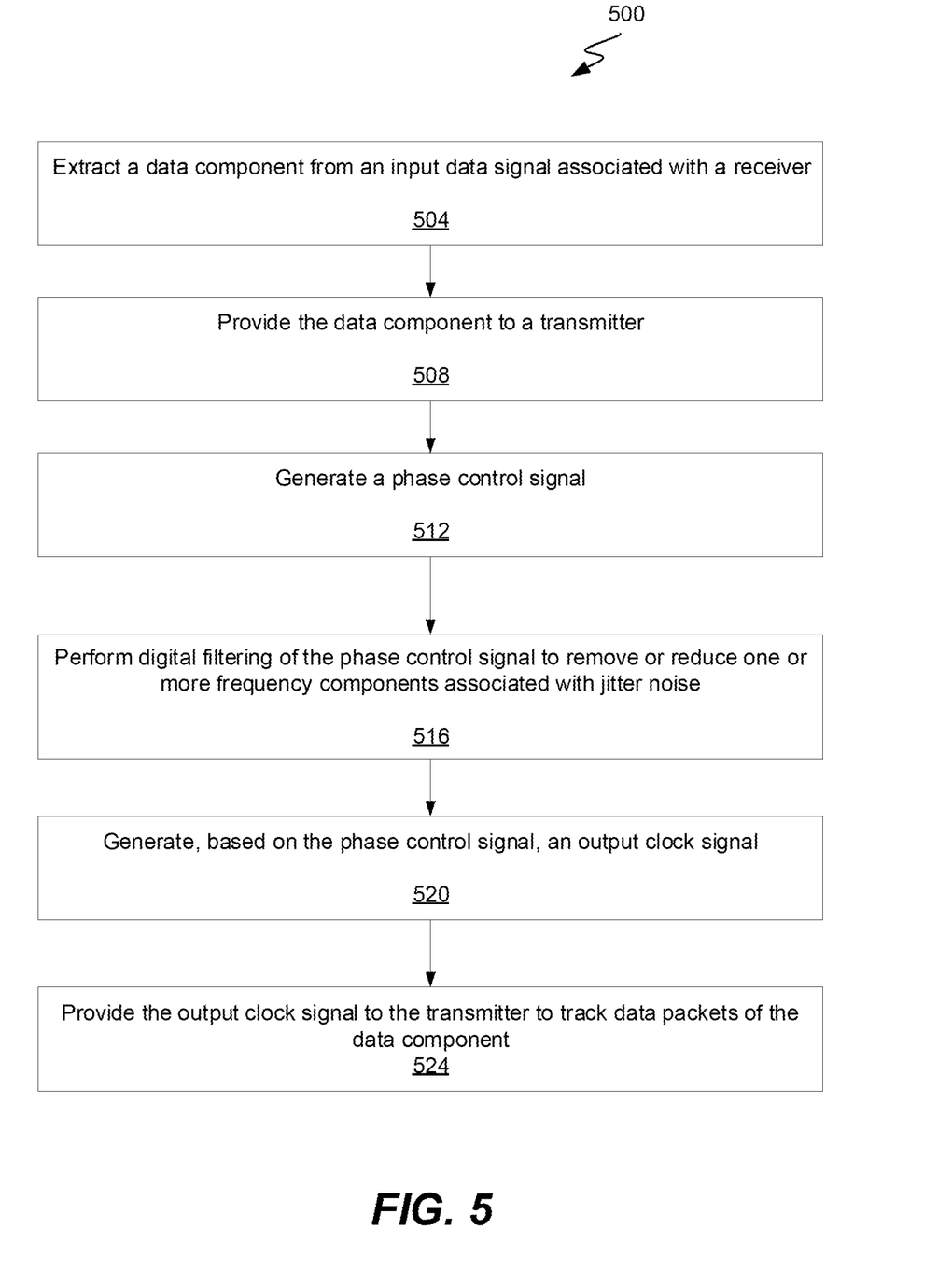
FIG. 5 is a flow diagram depicting an example of a retiming method 500 performed according to some implementations.

FIG. 5 is a flow diagram depicting an example of a retiming method 500 performed according to some implementations. In FIG. 5, retiming method 500 includes, at 504, a CDR extracting a data component from an input data signal associated with a receiver, as described above. At 508, the data component is provided from the CDR to a transmitter, for instance, through a FIFO as described above. At 512, the CDR generates a phase control signal, as described above. In some implementations, at 516, a digital filter is incorporated to receive and perform digital filtering of the phase control signal to remove or reduce one or more frequency components associated with jitter noise. At 520, a phase interpolator receives the phase control signal from the digital filter and generates, based on the phase control signal, an output clock signal. At 524, the phase interpolator provides the output clock signal to the transmitter to track data packets of the data component.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. Retimer circuitry comprising:
clock data recovery circuitry to be coupled between a receiver and a transmitter, the clock data recovery circuitry configured to:
extract a data component from an input data signal associated with the receiver,
provide the data component to the transmitter, and
generate a phase control signal comprising control codes for controlling a phase interpolator to change a phase of a base clock signal; and
phase interpolator circuitry coupled with the clock data recovery circuitry, the phase interpolator circuitry comprising the phase interpolator configured to:
receive the phase control signal and the base clock signal,
generate, based on the phase control signal and on the base clock signal, an output clock signal, and
provide the output clock signal to the transmitter to track data packets of the data component.

2. The retimer circuitry of claim 1, further comprising:
an analog-to-digital converter coupled between the receiver and the clock data recovery circuitry, and
a further phase interpolator of the phase interpolator circuitry, the further phase interpolator configured to:
receive the phase control signal,
generate, based on the phase control signal, a further output clock signal, and
provide the further output clock signal to the analog-to-digital converter,
the analog-to-digital converter configured to generate the input data signal based on the further output clock signal.

3. The retimer circuitry of claim 2, wherein one or more electrical characteristics of the further phase interpolator match one or more electrical characteristics of the phase interpolator.

4. The retimer circuitry of claim 2, wherein the phase interpolator and the further phase interpolator are configured to generate the respective output clock signals based on the phase control signal by processing the control codes of the phase control signal to control a phase of the base clock signal.

5. The retimer circuitry of claim 1, further comprising:
a digital filter coupled between the clock data recovery circuitry and the phase interpolator, the digital filter configured to perform digital filtering of the phase control signal to remove or reduce one or more frequency components associated with jitter noise.

6. The retimer circuitry of claim 5, wherein the digital filter comprises one or more low-pass filters.

7. The retimer circuitry of claim 6, wherein a low-pass filter comprises one or more moving average filters.

8. The retimer circuitry of claim 7, wherein a moving average filter is configured according to:

$$OUT(m,\text{next})=OUT(m,\text{previous})+1/m(X(n+1)-X(n-m+1)),$$

wherein OUT(m) is a smoothed output of the moving average filter, X(n) is a sequence of control codes of the phase control signal, and m is a dividing factor.

9. The retimer circuitry of claim 7, wherein a moving average filter is configured according to:

$$OUT(n)=OUT(n-1)+1/N(P(n)-P(n-N)),$$

wherein OUT(n) is a smoothed output of the moving average filter, P(n) is a sequence of control codes of the phase control signal, $N=2^m$, and m is a dividing factor.

10. The retimer circuitry of claim 9, wherein the moving average filter comprises two or more m-bit shift circuits, two or more delay units, and two or more adders.

11. The retimer circuitry of claim 7, wherein the low-pass filter comprises two or more moving average filters coupled in series and having different configurations.

12. A retimer system comprising:
a first device;
a second device; and
a data interface connecting the first and second devices, the data interface comprising a repeater, the repeater comprising:
clock data recovery circuitry coupled between a receiver in communication with the first device and a transmitter in communication with the second device, the clock data recovery circuitry configured to:
extract a data component from an input data signal associated with the receiver,
provide the data component to the transmitter, and
generate a phase control signal comprising control codes for controlling a phase interpolator to change a phase of a base clock signal; and
phase interpolator circuitry coupled with the clock data recovery circuitry, the phase interpolator circuitry comprising the phase interpolator configured to:
receive the phase control signal and the base clock signal,
generate, based on the phase control signal and on the base clock signal, an output clock signal, and
provide the output clock signal to the transmitter to track data packets of the data component.

13. The retimer system of claim 12, the repeater further comprising:
an analog-to-digital converter coupled between the receiver and the clock data recovery circuitry, and
a further phase interpolator of the phase interpolator circuitry, the further phase interpolator configured to:
receive the phase control signal,
generate, based on the phase control signal, a further output clock signal, and
provide the further output clock signal to the analog-to-digital converter,
the analog-to-digital converter configured to generate the input data signal based on the further output clock signal.

14. The retimer system of claim 13, wherein one or more electrical characteristics of the further phase interpolator match one or more electrical characteristics of the phase interpolator.

15. The retimer system of claim 13, wherein the phase interpolator and the further phase interpolator are configured to generate the respective output clock signals based on the phase control signal by processing the control codes of the phase control signal to control a phase of the base clock signal.

16. The retimer system of claim 12, the repeater further comprising:
a digital filter coupled between the clock data recovery circuitry and the phase interpolator, the digital filter configured to perform digital filtering of the phase control signal to remove or reduce one or more frequency components associated with jitter noise.

17. The retimer system of claim 16, wherein the digital filter comprises one or more low-pass filters.

18. The retimer system of claim 17, wherein a low-pass filter comprises one or more moving average filters.

19. The retimer system of claim 18, wherein a moving average filter comprises two or more m-bit shift circuits, two or more delay units, and two or more adders.

20. The retimer system of claim 18, wherein the low-pass filter comprises two or more moving average filters coupled in series and having different configurations.

21. A retiming method comprising:
extracting a data component from an input data signal associated with a receiver;
providing the data component to a transmitter;
generating a phase control signal comprising control codes for controlling a phase interpolator of phase interpolator circuitry to change a phase of a base clock signal;
generating, by the phase interpolator based on the phase control signal and on the base clock signal, an output clock signal; and providing the output clock signal to the transmitter to track data packets of the data component.

22. The retiming method of claim 21, further comprising: performing digital filtering of the phase control signal to remove or reduce one or more frequency components associated with jitter noise.

23. The retiming method of claim 22, wherein the digital filtering of the phase control signal comprises moving average filtering according to:

$$OUT(m, \text{next}) = OUT(m, \text{previous}) + 1/m(X(n+1) - X(n-m+1)),$$

wherein OUT(m) is a smoothed output of the moving average filtering, X(n) is a sequence of control codes of the phase control signal, and m is a dividing factor.

24. The retiming method of claim 22, wherein the digital filtering of the phase control signal comprises moving average filtering according to:

$$OUT(n) = OUT(n-1) + 1/N(P(n) - P(n-N)),$$

wherein OUT(n) is a smoothed output of the moving average filtering, P(n) is a sequence of control codes of the phase control signal, N=2^m, and m is a dividing factor.

25. The retiming method of claim 22, wherein the digital filtering of the phase control signal comprises low-pass filtering.

\* \* \* \* \*